(12) United States Patent
Kokubo et al.

(10) Patent No.: US 12,740,177 B2
(45) Date of Patent: Sep. 15, 2026

(54) ELECTRONIC DEVICE MEMBER AND ELECTRONIC DEVICES

(71) Applicant: TDK Corporation, Tokyo (JP)

(72) Inventors: Maiko Kokubo, Tokyo (JP); Shinji Hara, Tokyo (JP); Naoki Ohta, Tokyo (JP); Susumu Aoki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 135 days.

(21) Appl. No.: 18/797,588

(22) Filed: Aug. 8, 2024

(65) Prior Publication Data

US 2025/0107262 A1 Mar. 27, 2025

(30) Foreign Application Priority Data

Sep. 27, 2023 (JP) ................................ 2023-166240

(51) Int. Cl.
*H10F 39/00* (2025.01)
*H10F 39/18* (2025.01)

(52) U.S. Cl.
CPC ......... *H10F 39/811* (2025.01); *H10F 39/184* (2025.01)

(58) Field of Classification Search
CPC ............................ H10F 39/811; H10F 39/184
See application file for complete search history.

(56) References Cited

U.S. PATENT DOCUMENTS

2003/0146017 A1* 8/2003 Fan .................... H10W 70/635 174/138 G
2006/0126264 A1* 6/2006 Yoshii .................... H01G 4/232 361/728
2014/0090698 A1* 4/2014 Kumai .................. H10F 19/908 174/250
2020/0259064 A1* 8/2020 Lewandowski ...... H10N 60/815
2020/0408604 A1 12/2020 Ohta et al.
2024/0006287 A1* 1/2024 Hori .................... H10W 70/611

FOREIGN PATENT DOCUMENTS

WO 2019/171488 A1 9/2019

* cited by examiner

*Primary Examiner* — Hugh Maupin
(74) *Attorney, Agent, or Firm* — Oliff PLC

(57) ABSTRACT

Electronic device member comprises a first substrate, at least one protruding portion that protrudes from the first substrate, and a solder layer, wherein the at least one protruding portion includes at least one side surface, a tip surface, and a connection portion between the at least one side surface and the tip surface, and wherein the solder layer is in contact with the tip surface. At the connection portion, the at least one side surface and the tip surface form obtuse angle.

8 Claims, 10 Drawing Sheets

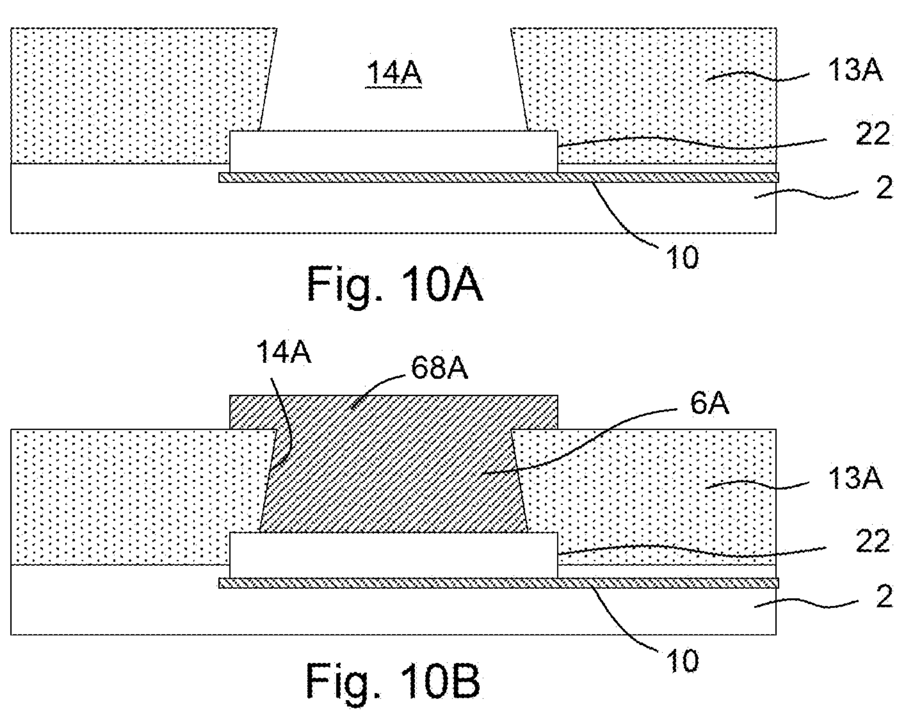
Fig. 10A
Fig. 10B
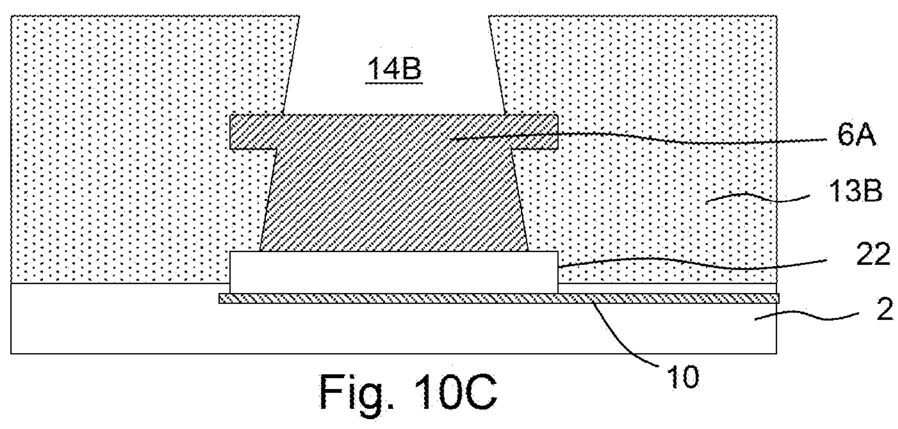
Fig. 10C
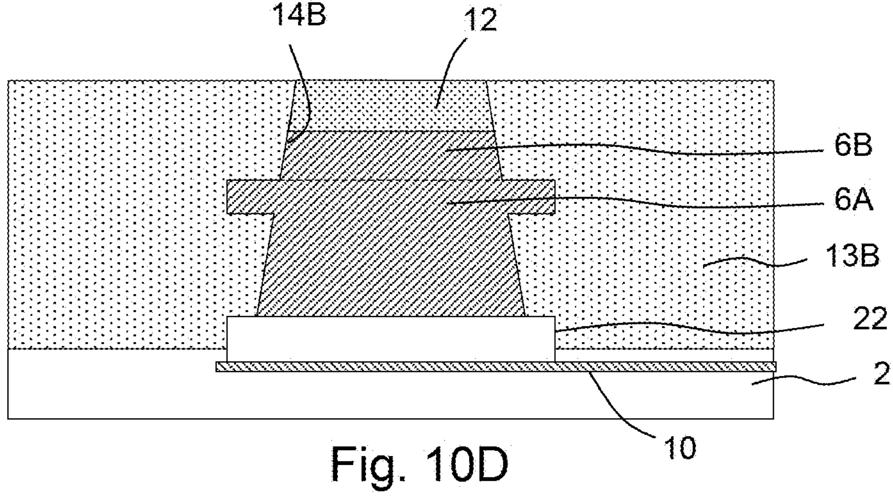
Fig. 10D

ELECTRONIC DEVICE MEMBER AND ELECTRONIC DEVICES

FIELD

This application claims the benefit of Japanese Priority Patent Application No. JP2023-166240 filed on Sep. 27, 2023, the entire contents of which are incorporated herein by reference.

The present disclosure relates to an electronic device member and an electronic device including the same.

BACKGROUND

Electronic devices having elements disposed between two substrates are known. WO 2019/171488 describes an infrared sensor in which multiple bolometer films are arranged between two substrates. The two substrates are connected by side walls, and a sealed space is formed between the two substrates and the side walls. A plurality of pillar-shaped electrical connection members is disposed in the sealed space to electrically connect the two substrates. The thickness of the side walls and the electrical connection members is constant in the height direction.

SUMMARY

The electrical connection members and the side walls may be joined to one of the substrates by a solder layer. If the solder layer has insufficient joining reliability, the functionality of the side walls and electrical connection members will be affected. For this reason, it is desirable that the solder layer has high joining reliability.

The electronic device member of the present disclosure comprises a first substrate, at least one protruding portion that protrudes from the first substrate, and a solder layer, wherein the at least one protruding portion comprises at least one side surface, a tip surface, and a connection portion between the at least one side surface and the tip surface, and wherein the solder layer is in contact with the tip surface. At least one side surface and the tip surface form an obtuse angle at the connection portion.

The above and other objects, features and advantages of the present application will become more apparent from the following detailed description taken in conjunction with the accompanying drawings illustrating the present application.

BRIEF DESCRIPTION OF THE DRAWINGS

The accompanying drawings are included to provide a further understanding of the disclosure and are incorporated in and constitute a part of this specification. The drawings illustrate example embodiments and, together with the specification, serve to explain the principles of the technology.

FIGS. 10A to 10D are schematic diagrams illustrating a method for forming an electrical connection member according to the third embodiment;

DETAILED DESCRIPTION

Figures 1, 2:
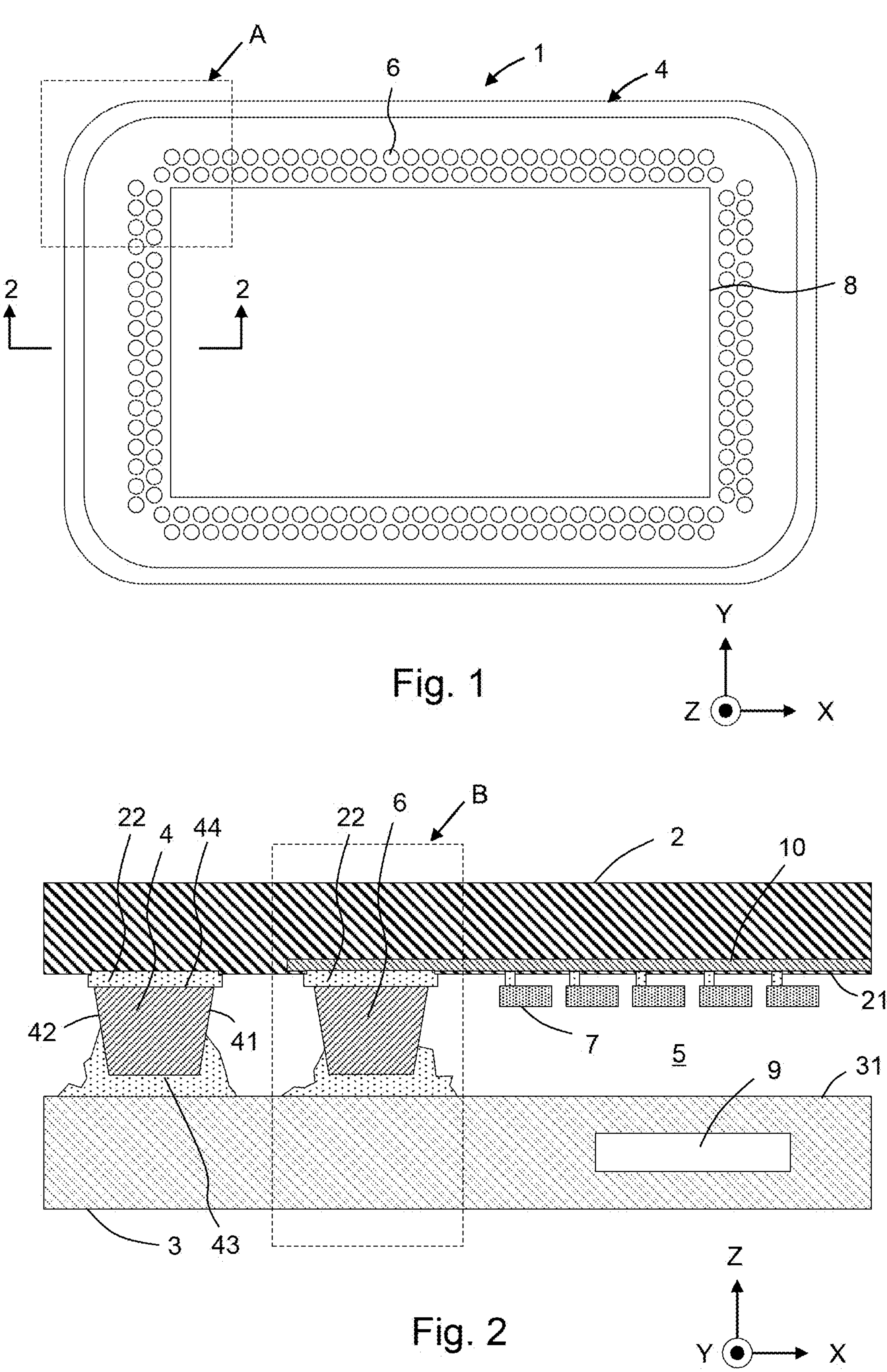
FIG. 1 is a schematic plan view of an infrared sensor according to a first embodiment.
FIG. 2 is a schematic partial cross-sectional view of the infrared sensor taken along line 2-2 of FIG. 1.

Example embodiments and modifications of the technology are next described in detail with reference to the accompanying drawings. Note that the following description is directed to illustrative examples of the disclosure and is not to be construed as limiting the technology. Factors including but not limited to numerical values, shapes, materials, components, positions of the components, and how the components are coupled to each other are illustrative only and are not to be construed as limiting the technology. Further, elements in the following example embodiments which are not recited in a most-generic independent claim of the disclosure are optional and may be provided on an as-needed basis. The drawings are schematic and are not intended to be drawn to scale. Like elements are denoted with the same reference numerals to avoid redundant descriptions.

An object of the present disclosure is to provide an electronic device member that can easily ensure high joining reliability of a solder layer.

Embodiments of an electronic device member according to the present disclosure and an electronic device having the electronic device member are hereinbelow described with reference to the drawings. The drawings are schematic diagrams for illustrating the present disclosure, and shapes and sizes may not be the same among the drawings. In the following description and drawings, the X-direction and the Y-direction are parallel to principal surface 21 of first substrate 2 and principal surface 31 of second substrate 3. Principal surfaces 21 and 31 are surfaces of first substrate 2 and second substrate 3 that face each other. The X-direction and the Y-direction are perpendicular to each other. The Z-direction is a direction perpendicular to the X-direction and the Y-direction and is a direction perpendicular to principal surfaces 21 and 31 of first substrate 2 and second substrate 3, or a direction in which first substrate 2 and second substrate 3 are stacked.

In the following embodiments, infrared sensor 1 will be described as an example of an electronic device. Infrared sensor 1 is mainly used as an imaging element of an infrared camera. Infrared cameras can be used as night vision scopes or goggles in dark places and can also be used to measure the temperature of people and objects. In the present disclosure, the detection target is not limited to infrared rays. The electronic device of the present disclosure can be applied to an electromagnetic wave sensor that detects electromagnetic waves including, for example, terahertz waves or near-infrared waves. In addition, as will be described later, the present disclosure is also applicable to various electronic devices other than electromagnetic wave sensors.

First Embodiment

Figures 3A, 3B, 4:
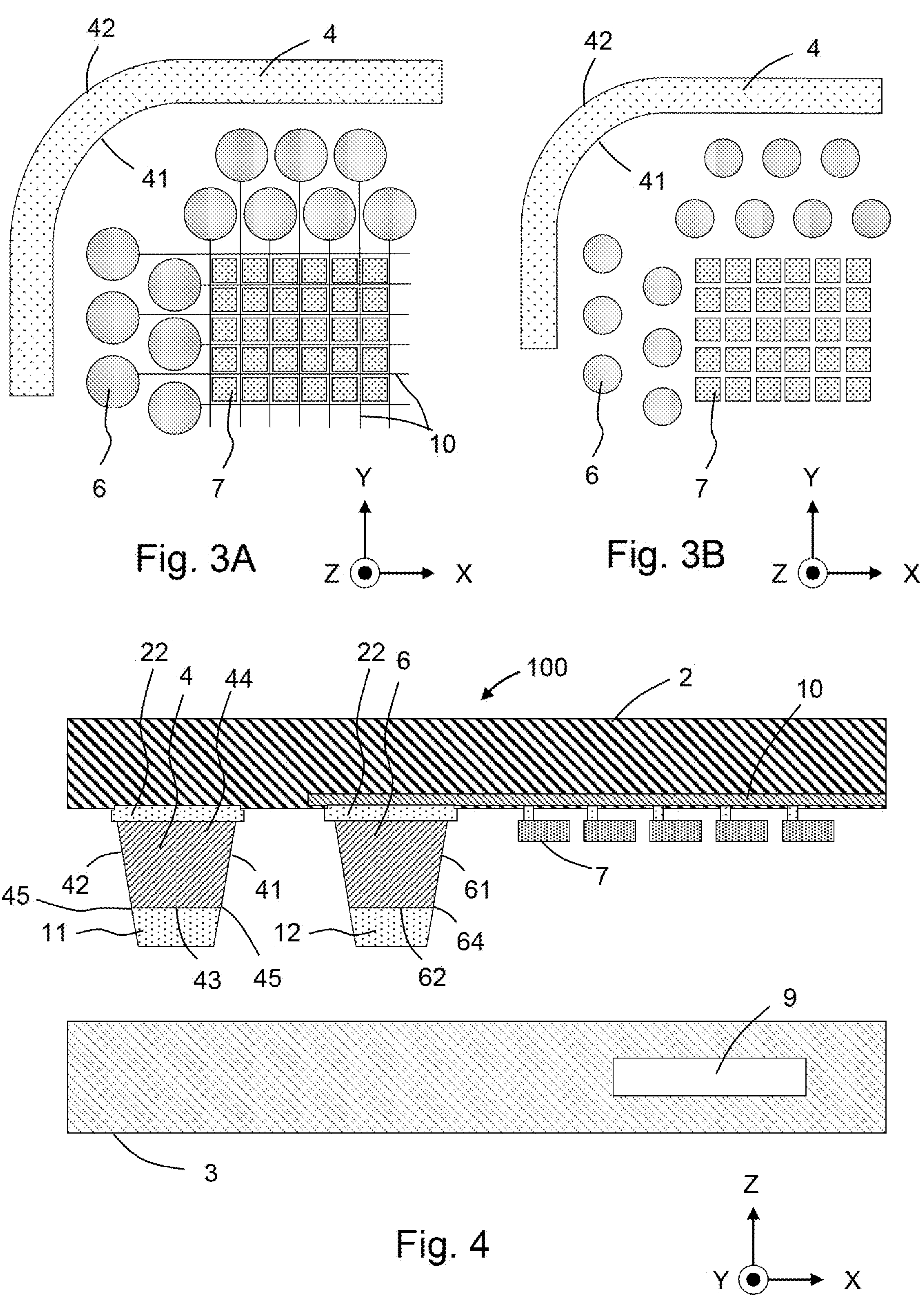
FIG. 3A is a schematic plan view showing a positional relationship between: electrical connection members on a first substrate side; and side walls, a thermistor element, and lead wires in portion A shown in FIG. 1.
FIG. 3B is a schematic plan view showing a positional relationship between: electrical connection members on a second substrate side and side walls and a thermistor element in portion A shown in FIG. 1.
FIG. 4 is a schematic cross-sectional view of a first substrate and a second substrate before joining.

FIG. 1 is a schematic plan view of infrared sensor 1, and FIG. 2 is a schematic partial cross-sectional view of infrared sensor 1 taken along line 2-2 of FIG. 1. For the sake of convenience, only one electrical connection member 6 is shown in FIG. 2. FIG. 3A is a schematic plan view showing the positional relationship between: electrical connection member 6 on first substrate 2 side and side wall 4, a plurality of thermistor elements 7, and plurality of lead wires 10 in portion A shown in FIG. 1. FIG. 3B is a schematic plan view showing the positional relationship between: electrical connection member 6 on second substrate 3 side and side wall 4 and a plurality of thermistor elements 7 in portion A shown in FIG. 1. As shown in FIG. 2, infrared sensor 1 comprises first substrate 2 and second substrate 3 that are arranged opposite each other and side walls 4 that connect first substrate 2 and second substrate 3. First substrate 2 and second substrate 3 are mainly formed of silicon substrates, and an insulating film that covers lead wires 10, circuit part 9, and the like is formed on the silicon substrate. In FIG. 2, an insulating layer is shown as being integrated with first substrate 2 and second substrate 3. Inner space 5, which is sealed, is formed by first substrate 2, second substrate 3, and side walls 4. A plurality of thermistor elements 7 that function as sensing parts of infrared sensors 1 is provided in inner space 5. The plurality of thermistor elements 7 is arranged in rectangular region 8 as shown in FIG. 1 and forms a two-dimensional lattice array consisting of a plurality of rows extending in the X-direction and a plurality of columns extending in the Y-direction as shown in FIG. 3A. Inner space 5 is under negative pressure or under a vacuum, whereby gas convection in inner spaces 5 is prevented or reduced and thermal influence on thermistor elements 7 can be reduced.

First substrate 2 supports the plurality of thermistor elements 7. Second substrate 3 includes circuit part 9 such as a ROIC (Readout IC). First substrate 2 and second substrate 3 are connected by a plurality of electrical connection members 6. Electrical connection members 6 are conductors having a truncated cone shape. Electrical connection members 6 are disposed in inner space 5. Electrical connection members 6 are connected to lead wires 10 arranged in an array, and lead wires 10 are connected to thermistor elements 7. Thermistor elements 7 are thus electrically connected to circuit part 9 via electrical connection members 6 and lead wires 10. At least one pad (not shown) for inputting and outputting signals to and from the outside is formed on the outer side of side wall 4 of second substrate 3.

FIG. 4 is a schematic cross-sectional view of first substrate 2 and second substrate 3 before they are joined together. Side wall 4 is fixed to first substrate 2 in advance. Side wall 4 is one protruding portion that protrudes from first substrate 2 in the Z-direction. Side wall 4 is made of, for example, Ni, and is produced by plating. Side wall 4 is a rectangular frame portion with rounded corners when viewed in a plan view from the Z-direction (see FIG. 1) and has a continuous frame shape in any cross-section perpendicular to the Z-direction. That is, side wall 4 is a single continuous closed wall body and surrounds region 8 in which the plurality of thermistor elements 7 is arranged. Side wall 4 includes two sides (inner side 41 and outer side 42), frame-shaped tip surface 43, and frame-shaped base surface 44 connected to first substrate 2, tip surface 43 and base surface 44 being generally planar. Solder layer 11, which is frame-shaped, is provided on tip surface 43. Solder layer 11 is provided on tip surface 43 before first substrate 2 and second substrate 3 are joined together. Solder layer 11 is made of AuSn, but the material of solder layer 11 is not limited. Electrical connection members 6 will be described in detail below.

Figures 5, 6:
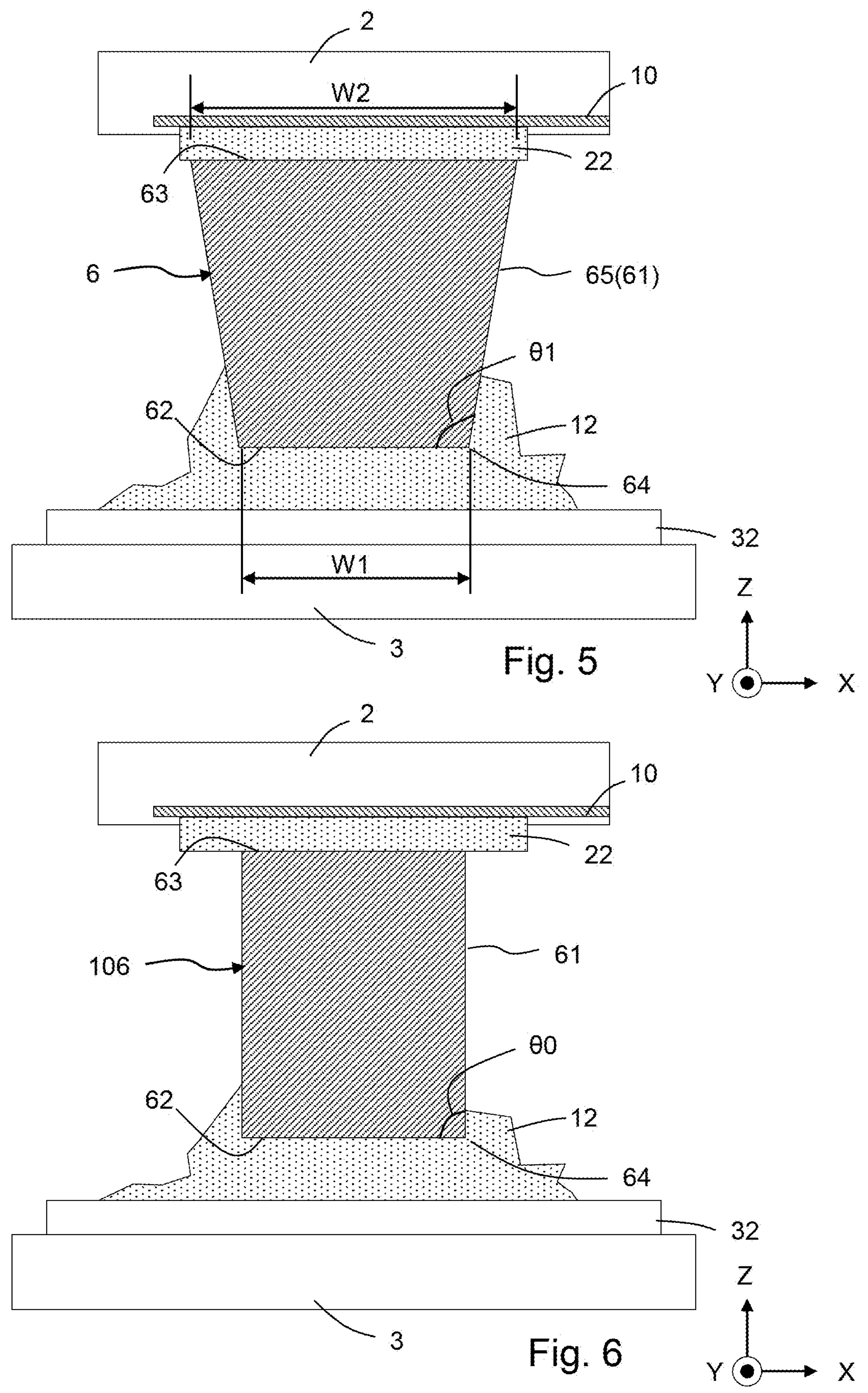
FIG. 5 is a schematic cross-sectional view of the first substrate and the second substrate after joining.
FIG. 6 is a schematic cross-sectional view of an electrical connection member of a comparative example.

FIG. 5 is a schematic cross-sectional view of first substrate 2 and second substrate 3 after joining. FIG. 5 is an enlarged view of part B shown in FIG. 2 and shows electrical connection member 6 and solder layer 12 in more detail. Since electrical connection members 6 have substantially the same configuration, only one of electrical connection members 6 will be described here. Electrical connection member 6 is a protruding portion that protrudes from first substrate 2 in the Z-direction. Electrical connection member 6 is made of, for example, Ni, and is produced by plating. Making electrical connection members 6 and side walls 4 from the same material simplifies the plating process. Electrical connection members 6 may extend in an oblique direction with respect to principal surface 21 of first substrate 2 (i.e., in a direction tilted from the Z-direction). Electrical connection member 6 includes one side surface 61 which is a curved shape, tip surface 62 connected to side surface 61, and base surface 63 connected to side surface 61, tip surface 62 and base surface 63 being generally planar. Base surface 63 is located on the side opposite to tip surface 62 in the direction in which electrical connection member 6, which is the protruding portion, protrudes (the Z-direction in this embodiment). As shown in FIG. 4, solder layer 12 is provided on tip surface 62 before first substrate 2 and second substrate 3 are joined together. Solder layer 12 is made of AuSn, but the material of solder layer 12 is not limited. Underlayer 22 for connection with electrical connection member 6 is provided on first substrate 2, and lead wire 10 and electrical connection member 6 are electrically connected via underlayer 22. Second substrate 3 is provided with pad portion 32 for connection to electrical connection member 6. Base surface 63 contacts underlayer 22, and solder layer 12 contacts pad portion 32. In FIGS. 2 and 4, pad portion 32 is omitted.

First substrate 2, side wall 4, the plurality of electrical connection members 6, solder layer 11 provided on side wall 4, and solder layer 12 provided on each of the plurality of electrical connection members 6 constitute electronic device member 100 (see FIG. 4) in an electronic device (in this embodiment, an infrared sensor 1). An electronic device (infrared sensor 1 in this embodiment) can be produced by joining electronic device member 100 to second substrate 3. Electric device member 100 is a member for an electric device (infrared sensor 1 in this embodiment). The procedure for joining electronic device member 100 to second substrate 3 is as follows: First, first substrate 2 is placed above second substrate 3 as shown in FIG. 4. Next, solder layers 12 on tip surfaces 62 of multiple electrical connection members 6 and solder layer 11 on tip surface 43 of side wall 4 are pressed downward against second substrate 3, and in this state, solder layers 11 and 12 are heated. Solder layers 11 and 12 melt or soften when heated. When pressed, a portion of the molten or softened solder layers 11 and 12 flows around side surfaces 61 of electrical connection members 6 and the side surfaces (inner side surface 41 and outer side surface 42) of side wall 4. As shown in FIG. 5, solder layer 12 of electrical connection member 6 contacts tip surface 62 and side surface 61 of electrical connection member 6, whereby electrical connection member 6 is firmly joined to second substrate 3. Similarly, although not shown, solder layer 11 of side wall 4 contacts tip surface 43 and the side surfaces (inner side surface 41 and outer side surface 42) of side wall 4, whereby side wall 4 is firmly joined to second substrate 3. In this manner, first substrate 2 is joined to second substrate 3 via the protruding portions (side wall 4 and multiple electrical connection members 6) and solder layers 11 and 12 to form an electronic device (infrared sensor 1).

FIG. 6 is a partially enlarged view of electrical connection member 106 and solder layer 12 of a comparative example. The configuration and effects of electrical connection member 6 of this embodiment will be described in more detail with reference to FIGS. 5 and 6. In this embodiment, electrical connection member 6 roughly has a truncated cone shape whose central axis is parallel to the Z-direction and whose tip surface 62 is smaller than base surface 63. Electrical connection member 6 has a circular shape in any cross-section perpendicular to the Z-direction, and the width of electrical connection member 6 monotonically decreases from base surface 63 to tip surface 62. The width of electrical connection member 6 refers to the minimum distance between two intersections where a straight line passing through the center of gravity of electrical connection member 6 intersects with side surfaces 61 of electrical connection member 6 in a cross-section perpendicular to the Z-direction. In electrical connection member 6 of this embodiment, any cross-section perpendicular to the Z-direction is a circle, and the width is therefore synonymous with the diameter, but electrical connection member 6 may have a cross-sectional shape other than a circle (e.g., an ellipse or a polygon), in which case the width is defined as above.

As shown in FIG. 5, in this embodiment, side surface 61 and tip surface 62 form obtuse angle θ1, that is, an angle exceeding 90 degrees, at connection portion 64 between side surface 61 and tip surface 62 of electrical connection member 6. The angle between side surface 61 and tip surface 62 is defined in any cross section that passes through the center line of electrical connection member 6 and is parallel to the Z-direction (FIG. 5 is an example of this cross section). Electrical connection member 6 of the comparative example is cylindrical with its center axis parallel to the Z-direction. At connection portion 64 between side surface 61 and tip surface 62 of electrical connection member 106, side surface 61 and tip surface 62 form right angle θ0. In this embodiment, when solder layer 12 is heated and pressed, solder layer 12 tends to creep up toward first substrate 2 along side surface 61 of electrical connection member 6. This is because solder layer 12 that overflows onto the radially outer side of electrical connection member 6 tends to creep up along side surface 61. In contrast, in the comparative example, solder layer 12 is less likely to creep up along side surface 61 of electrical connection member 106, and the area of side surface 61 that is covered with solder layer 12 is smaller than in the embodiment. As a result, in this embodiment, the joining reliability of electrical connection member 6 with second substrate 3 is improved compared to the comparative example, and the reliability of the electrical connection between first substrate 2 and second substrate 3 is also improved.

Connection portion 64 between side surface 61 and tip surface 62 of electrical connection member 6 is a starting point from which solder layer 12 creeps up along side surface 61 of electrical connection member 6. Therefore, by forming obtuse angle θ1 between side surface 61 and tip surface 62 at connection portion 64, the occurrence of the creeping up of solder layer 12 can be effectively enhanced. It should be noted that connection portion 64 does not necessarily have to be an edge shape and may be a curve in FIG. 5. In this case, the angle between the tangent to the curve at connection portion 64 and tip surface 62 may be obtuse angle θ1.

As described above, width W1 of tip surface 62 of electrical connection member 6 is smaller than width W2 of base surface 63. This impedes the spread of the molten or softened solder layer 12 in a radial direction of electrical connection member 6 on the side of second substrate 3. As shown in FIG. 3B, a plurality of electrical connection members 6 is arranged at high density on second substrate 3. By reducing width W1 (the diameter) of tip surface 62 of electrical connection members 6, the distance between electrical connection members 6 is increased, thereby reducing the possibility of solder layer 12 coming into contact with adjacent electrical connection members 6 and causing a short circuit.

As described above, each electrical connection member 6 has a roughly truncated cone shape, and side surface 61 of electrical connection member 6 forms a constant angle (gradient) with respect to tip surface 62 at any position in the Z-direction. That is, side surface 61 and tip surface 62 of electrical connection member 6 form obtuse angle θ1. Since side surface 61 and not just connection portion 64 forms obtuse angle θ1 with tip surface 62 as a whole, solder layer 12 will continue to creep up, and a wider area of side surface 61 can be covered with solder layer 12. As a result, the joining reliability is further improved. The shape of electrical connection member 6 is not limited to a truncated cone, and the same effect can be obtained as long as the width of electrical connection member 6 monotonically decreases from base surface 63 toward tip surface 62.

The range of side surface 61 that forms obtuse angle θ1 with tip surface 62 (hereinafter referred to as first region 65) is not limited to the entire side surface 61 but may be a range starting at connection portion 64 and ending at any position between connection portion 64 and base surface 63. In this embodiment, first region 65 coincides with the entire region of side surface 61. First region 65 forms a constant angle (gradient) with respect to tip surface 62, but the angle (gradient) may vary depending on the position in the Z-direction.

Side wall 4 is similar to electrical connection member 6, and the description of electrical connection member 6 is in principle applicable to side wall 4. FIG. 5 can be regarded as a cross-sectional view taken along an arbitrary plane perpendicular to the center line of the frame-shaped portion of side wall 4 and parallel to the Z-direction. Since side wall 4 has two side surfaces (inner side surface 41 and outer side surface 42), it may be that at connection portion 45 (see FIG. 4) between each of side surfaces 41 and 42 and tip surface 43, each side surface 41 and 42 forms obtuse angle θ1 with tip surface 43. However, any one of the side surfaces may form obtuse angle θ1 with tip surface 43 at connection portion 45 with tip surface 43. Although not shown in the drawings, for example, one side surface and tip surface 43 may form obtuse angle θ1, and the other side surface and tip surface 43 may form a right angle. That is, in the case of side wall 4, it is sufficient that at least one side surface and tip surface 43 form obtuse angle θ1 at connection portion 45 with tip surface 43. Similarly, at least one side surface may include a first region that forms obtuse angle θ1 with tip surface 43. If leakage occurs at the joint of side wall 4, the negative pressure or vacuum state in inner space 5 cannot be maintained, and the thermal effect on thermistor element 7 due to gas convection in inner space 5 becomes significant. In this embodiment, the sealing performance of the joint of side wall 4 is improved, and the performance of infrared sensor 1 can therefore be easily ensured.

Figure 7A:
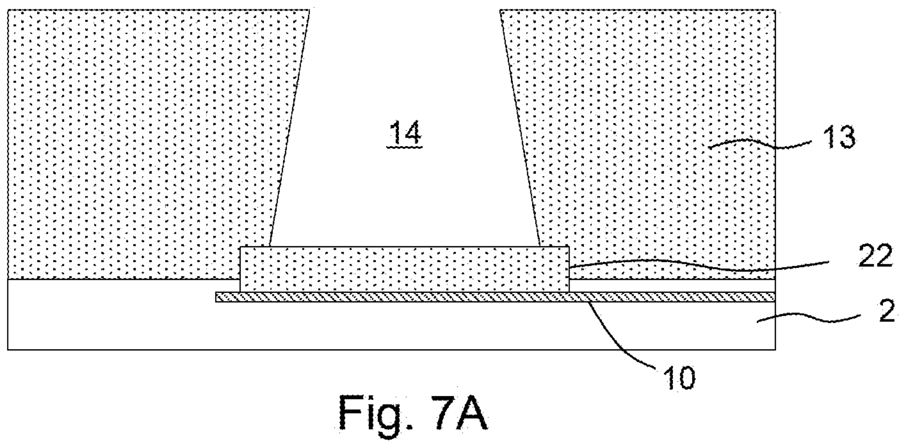
FIGS. 7A and 7B are schematic views showing a method for forming an electrical connection member according to the first embodiment.
Figure 7B:
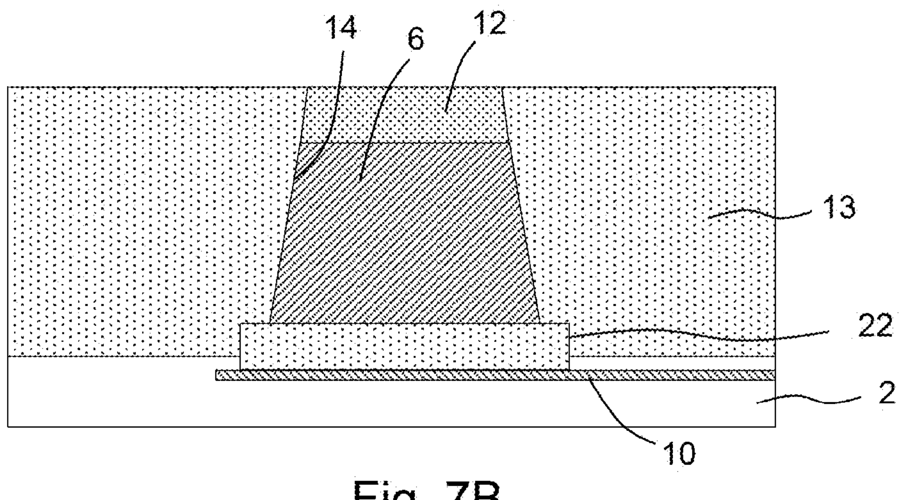

FIGS. 7A and 7B conceptually show a method for fabricating electrical connection member 6. FIGS. 7A and 7B are diagrams showing the structure upside down compared to FIGS. 2, 4, and 5. First, as shown in FIG. 7A, resist layer 13 is formed on first substrate 2, and cavity 14 having a truncated cone shape is formed in resist layer 13. Cavity 14 is formed by exposing and developing resist layer 13. During exposure, a truncated cone shaped area can be exposed by moving the focal position in the Z-direction while increasing or decreasing the diameter of the light beam. Although not shown, an electrode layer for plating is formed on underlayer 22 before resist layer 13 is formed. Next, as shown in FIG. 7B, electrical connection member 6 and solder layer 12 are formed in cavity 14 of resist layer 13 by a plating process. Thereafter, resist layer 13 and unnecessary electrode film are removed, whereby electrical connection member 6 can be formed on first substrate 2. Side wall 4 can be formed in the same manner as electrical connection member 6.

Second Embodiment

Figure 8:
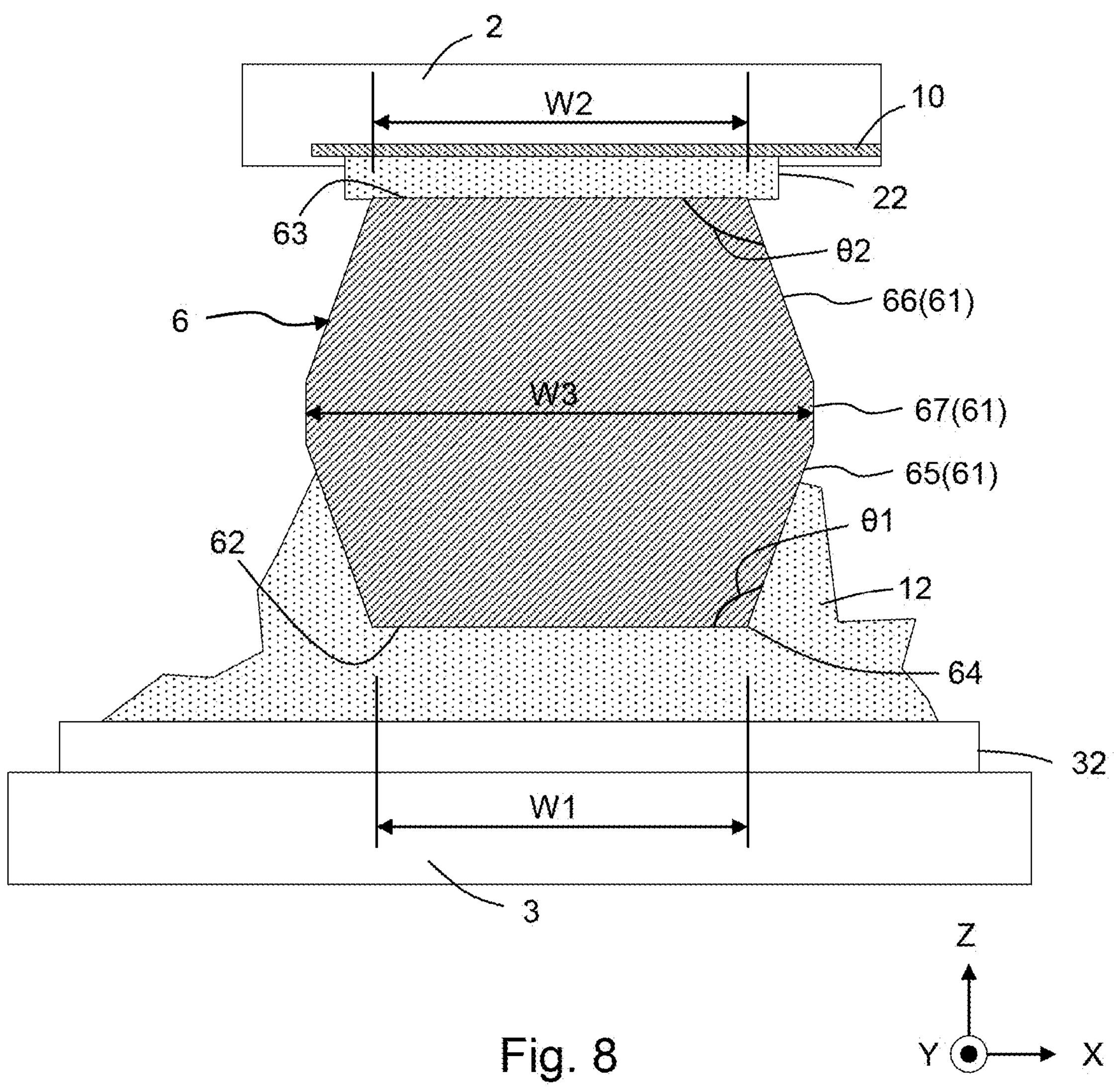
FIG. 8 is a schematic cross-sectional view of an electrical connection member according to a second embodiment.

FIG. 8 shows a cross-sectional view of a protruding portion according to the second embodiment. As described above, the protruding portion may be either electrical connection member 6 or side wall 4, but in this embodiment, the protruding portion is assumed to be electrical connection member 6. Side surface 61 of electrical connection member 6 includes first region 65 extending from connection portion 64 to a position between connection portion 64 and first substrate 2, and second region 66 located between base surface 63 and first region 65. Second region 66 reaches base surface 63, but it is sufficient that second region 66 is located at least partially between base surface 63 and first region 65 on side surface 61. As in the first embodiment, first region 65 of side surface 61 and tip surface 62 form obtuse angle θ1. Furthermore, second region 66 and base surface 63 form obtuse angle θ2. The width of electrical connection member 6 increases monotonically from tip surface 62 to base surface 63 in first region 65 and increases monotonically from base surface 63 to tip surface 62 in second region 66.

Electrical connection member 6 includes intermediate portion 67 having width W3 that is larger than both width W1 of tip surface 62 and width W2 of base surface 63. In this embodiment, intermediate portion 67 includes a side portion perpendicular to tip surface 62 that has a predetermined length in the Z-direction, but the length of this portion in the Z-direction may be zero. In other words, first region 65 and second region 66 may be separated from each other in the Z-direction or may be in contact with each other. First region 65 forms a constant angle (gradient) with respect to tip surface 62, and second region 66 has a constant angle (gradient) with respect to base surface 63, but the angle (gradient) of first region 65 and that of second region 66 may vary depending on the position in the Z-direction.

If solder layer 12 creeps up along side surface 61 to base surface 63, solder layer 12 may come into contact with an adjacent electrical connection member 6, causing a short circuit. In particular, since base surfaces 63 have a larger cross-sectional area than tip surfaces 62 as shown in FIG. 3A, the distance between adjacent electrical connection members 6 is smaller than that between tip surfaces 62. For this reason, it may be necessary to prevent solder layer 12 from creeping up to tip surface 62. Second region 66 forms obtuse angle θ2 with base surface 63 (in other words, second region 66 forms an acute angle with tip surface 62), and as a result, unlike first region 65, solder layer 12 is less likely to creep up along side surface 61. According to this embodiment, it is possible to ensure an area where solder layer 12 covers side surface 61 while reducing the possibility that solder layer 12 will reach base surface 63. Electrical connection member 6 can be formed in the same manner as in the first embodiment. During exposure, cavity 14 having a shape corresponding to electrical connection member 6 can be formed in resist layer 13 by moving the focal position of the light beam in the Z-direction while increasing or decreasing the diameter of the light beam.

Third Embodiment

Figure 9:
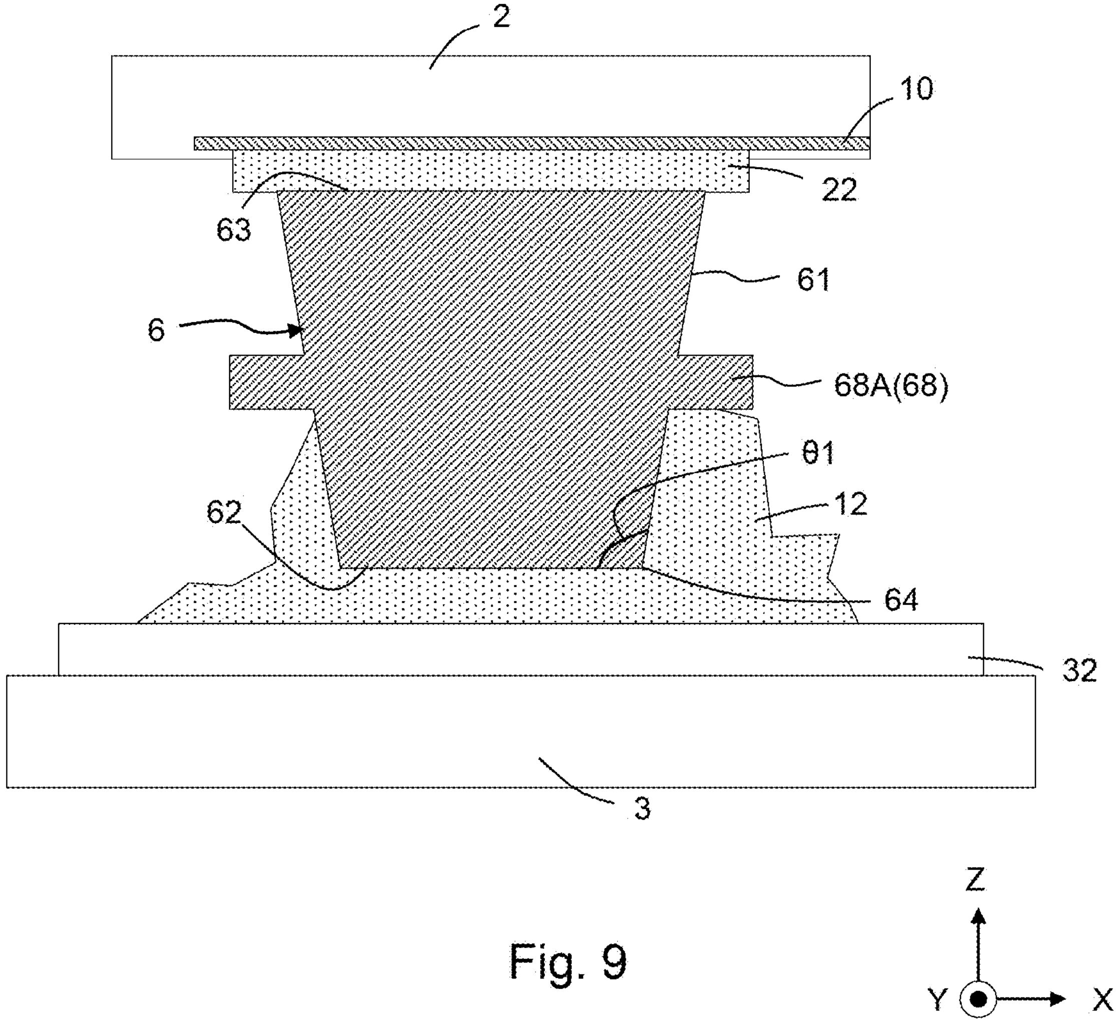
FIG. 9 is a schematic cross-sectional view of an electrical connection member according to a third embodiment.

FIG. 9 shows a cross-sectional view of a protruding portion according to the third embodiment. As described above, the protruding portion may be either electrical connection member 6 or may be side wall 4, but in this embodiment, the protruding portion is assumed to be electrical connection member 6. Electrical connection member 6 includes discontinuous portion 68 on side surface 61. The width of electrical connection member 6 discontinuously increases from tip surface 62 toward base surface 63 at discontinuous portion 68. In this embodiment, discontinuous portion 68 includes annular band-shaped portion 68A that protrudes in a direction that intersect the Z-direction. Discontinuous portion 68 includes annular band-shaped portion 68A that may protrude in a direction perpendicular to the Z-direction. When solder layer 12 reaches band-shaped portion 68A, band-shaped portion 68A inhibits solder layer 12 from creeping up, thereby reducing the possibility that solder layer 12 will creep further up toward base surface 63.

FIGS. 10A to 10D show a method for forming electrical connection member 6 of this embodiment. FIGS. 10A to 10D are diagrams showing the structure of FIG. 9, turned upside down. First, as shown in FIG. 10A, cavity 14A corresponding to the portion from tip surface 62 of electrical connection member 6 to the lower surface of band-shaped portion 68A is formed in resist layer 13A. Although not shown, an electrode layer for plating is formed on underlayer 22 before resist layer 13 is formed. Cavity 14A can be formed in a manner similar to that described in the first embodiment. Next, as shown in FIG. 10B, portion 6A from tip surface 62 of electrical connection member 6 to band-shaped portion 68A is formed by a plating process. At this time, the plating process is continued even after cavity 14A of resist layer 13A is completely filled with the metal constituting electrical connection member 6. The metal constituting electrical connection member 6 spreads radially outward from cavity 14A above cavity 14A to form band-shaped portion 68A. Next, resist layer 13A is completely removed and resist layer 13B is formed, and cavity 14B corresponding to portion 6B from the upper surface of band-shaped portion 68A of electrical connection member 6 to base surface 63 is formed above band-shaped portion 68A, as shown in FIG. 10C. Cavity 14B can be formed in a manner similar to that described in the first embodiment. Next, as shown in FIG. 10D, the metal constituting electrical connection member 6 is formed in cavity 14B by a plating process to form portion 6B. Solder layer 12 is further formed, after which resist layer 13B and unnecessary electrode film are removed.

Modification of Third Embodiment

Figure 11:
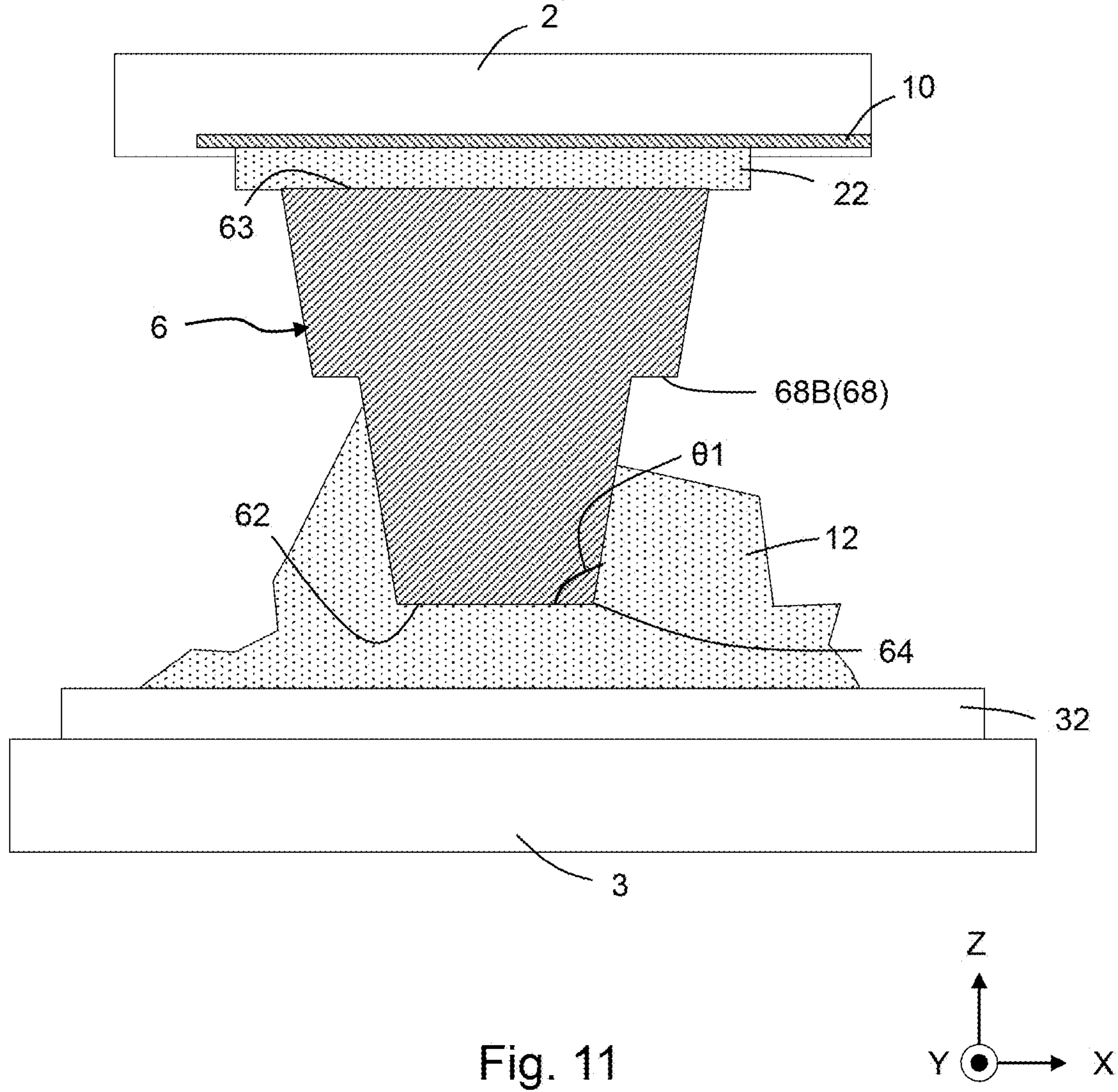
FIG. 11 is a schematic cross-sectional view of an electrical connection member according to a modification of the third embodiment.

FIG. 11 shows a cross-sectional view of a protruding portion according to a modification of the third embodiment. As described above, the protruding portion may be either electrical connection member 6 or may be side wall 4, but in this embodiment, the protruding portion is electrical connection member 6. Discontinuous portion 68 includes step portion 68B. The width of electrical connection member 6 is larger on the base surface 63 side of step portion 68B than on the tip surface 62 side of step portion 68B, and the width of electrical connection member 6 increases discontinuously from tip surface 62 to base surface 63 at discontinuous portion 68 (step portion 68B). When solder layer 12 reaches step portion 68B, step portion 68B inhibits solder layer 12 from creeping up, and the possibility of solder layer 12 creeping up further toward base surface 63 can thus be reduced.

Figure 12A:
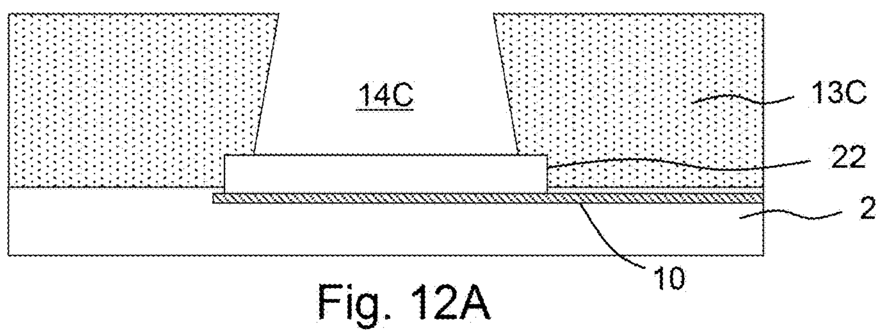
FIGS. 12A to 12D are schematic diagrams showing a method for forming an electrical connection member according to a modification of the third embodiment.
Figure 12B:
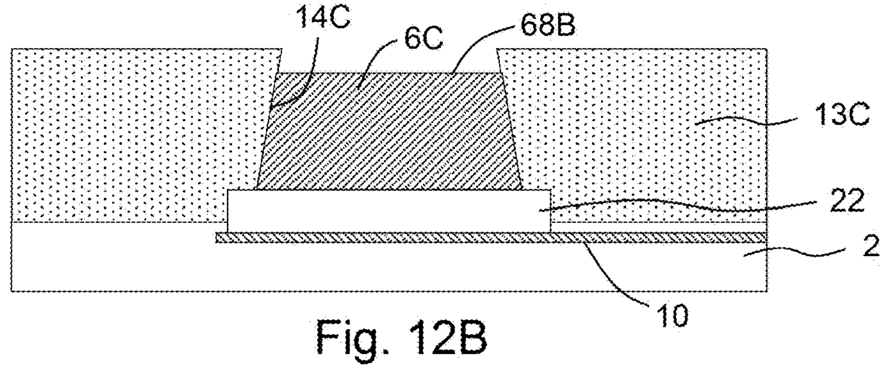

FIGS. 12A to 12D show a forming method of electrical connection member 6 for this modification. First, as shown in FIG. 12A, cavity 14C that has a larger dimension in the Z-direction than portion 6C from tip surface 62 of electrical connection member 6 to step portion 68B is formed in resist layer 13C. Although not shown, an electrode layer for plating is formed on underlayer 22 before resist layer 13C is formed. Here, cavity 14C that includes the portion of electrical connection member 6 above step portion 68B is formed, but the upper end of cavity 14C may coincide with step portion 68B. Cavity 14C can be formed in a manner similar to that described in the first embodiment. Next, as shown in FIG. 12B, portion 6C is formed by a plating process.

Figure 12C:
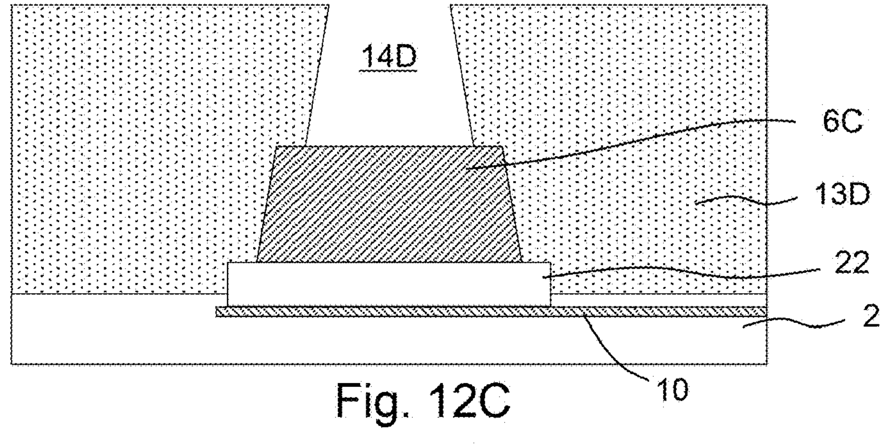
Figure 12D:
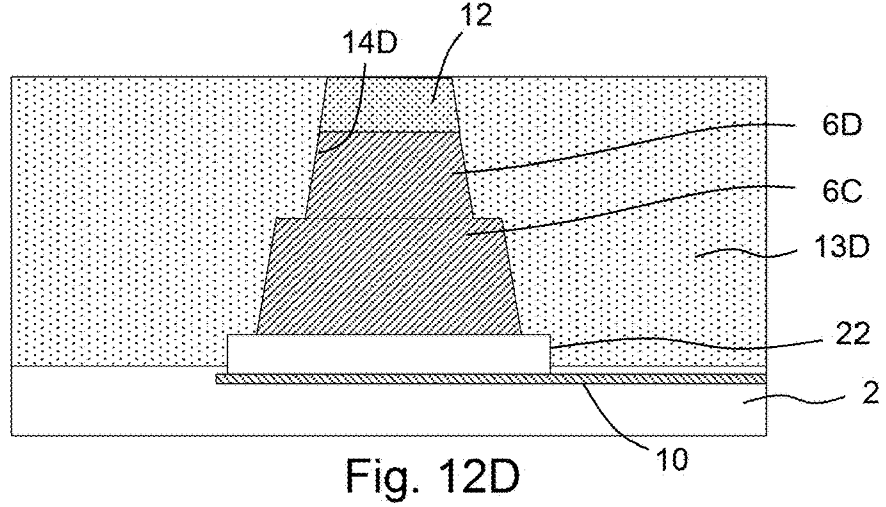

At this time, the plating process is temporarily stopped before cavity 14C of resist layer 13 is completely filled with the metal constituting electrical connection member 6. Next, resist layer 13C is completely removed, following which resist layer 13D is formed, and cavity 14D, which corresponds to portion 6D from step portion 68B to base surface of electrical connection member 6, is formed in an upward direction from step portion 68B as shown in FIG. 12C. Cavity 14D can be formed in a manner similar to that described in the first embodiment. Next, as shown in FIG. 12D, the metal constituting electrical connection member 6 is formed in cavity 14D by a plating process to form portion 6D, following which solder layer 12 is formed. Resist layer 13D and unnecessary electrode film are then removed.

Fourth Embodiment

Figures 13, 14:
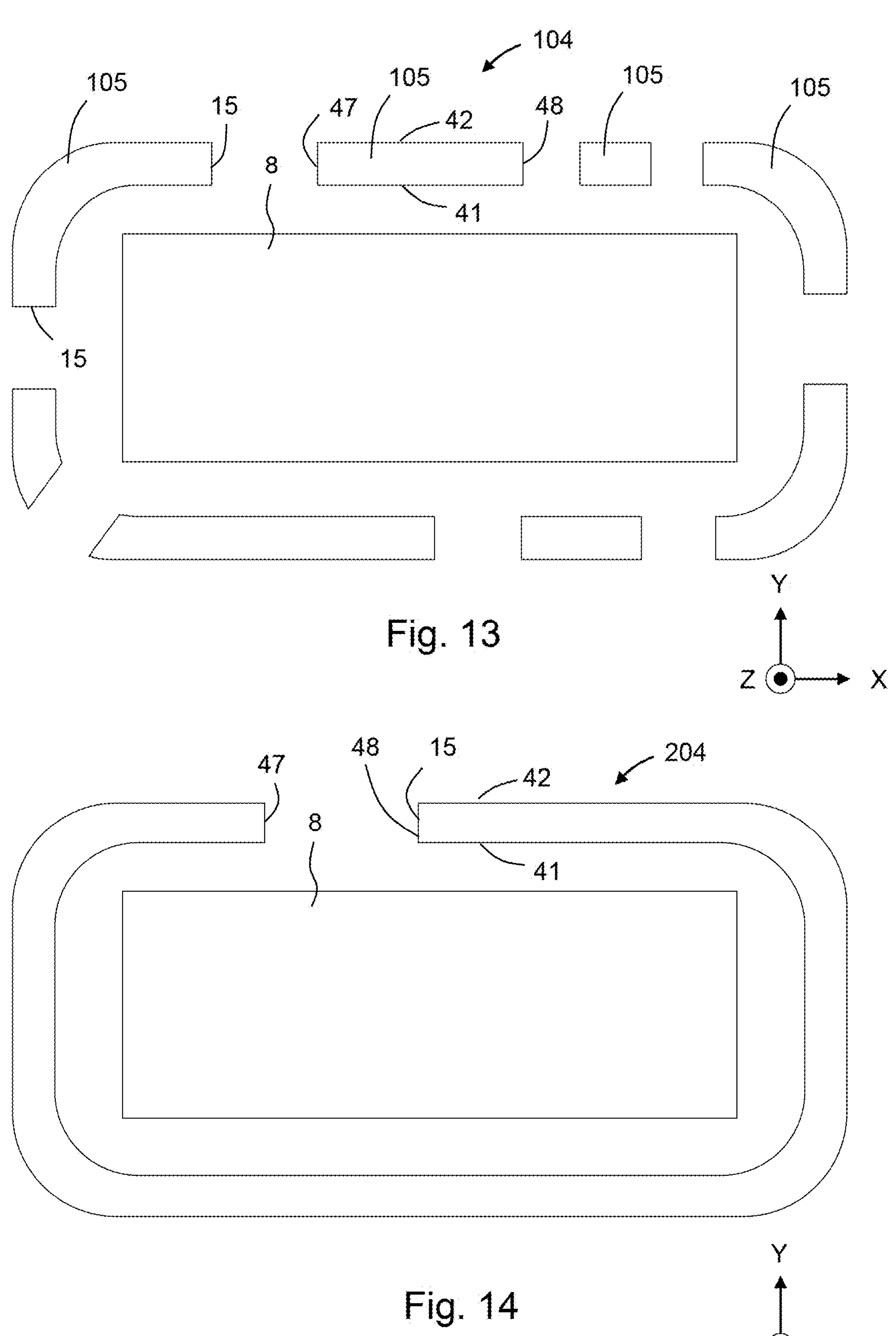
FIG. 13 is a schematic plan view of an electronic device member according to a fourth embodiment.
FIG. 14 is a schematic plan view of an electronic device member according to a modification of the fourth embodiment.

FIG. 13 shows side wall 104 of an electronic device member according to a fourth embodiment. Side wall 104 includes a plurality of protruding portions 105 that are divided, and the plurality of protruding portions 105 cooperate to form an interrupted frame shape in any cross-section perpendicular to the Z-direction. Side wall 104 thus fabricated includes therein a plurality of openings 15. This type of side wall 104 can be used in electronic devices that require communication with the outside, such as gas sensors. In this embodiment, side wall 104 may have a configuration similar to that of side wall 4 in each of the above-described embodiments and modifications. Each protruding portion 105 includes inner side surface 41 and outer side surface 42, as well as two side surfaces 47 and 48 that form opening 15. At connection portion 45 (see FIG. 4) between at least one of these side surfaces 41, 42, 47, 48 and tip surface 43, the side surface and tip surface 43 may form obtuse angle θ1. The first region of at least one of these side surfaces 41, 42, 47, and 48 and tip surface 43 may form obtuse angle θ1.

FIG. 14 shows side wall 204 of an electronic device member according to a modification of the fourth embodiment. Only one opening 15 is provided in side wall 204. Side wall 204 is one protruding portion. In this modification, side wall 204 includes inner side surface 41 and outer side surface 42, as well as two side surfaces 47 and 48 that form opening 15. However, at connection portion 45 (see FIG. 4) between at least one of these side surfaces 41, 42, 47, 48 and tip surface 43, the side surface and tip surface 43 may form obtuse angle θ1. Alternatively, the first region of at least one of these side surfaces 41, 42, 47, and 48 and tip surface 43 may form obtuse angle θ1.

Although certain embodiments of the present disclosure have been illustrated and described in detail, it will be understood that various changes and modifications can be made therein without departing from the spirit or scope of the appended claims.

LIST OF REFERENCE NUMERALS

1 infrared sensor (electronic device)
2 first substrate
3 second substrate
4, 104, 204 side wall (protruding portion)
6 electrical connection member (protruding portion)
11, 12 solder layer
41, 42, 47, 48, 61 side surface
43, 62 tip surface
44, 63 base surface
64 connection portion
65 first region
66 second region
67 intermediate portion
68 discontinuous portion
68A band-shaped portion
68B step portion
100 electronic device member

The invention claimed is:

1. An electronic device member comprising a first substrate, at least one protruding portion that protrudes from the first substrate, and a solder layer, wherein the at least one protruding portion comprises at least one side surface, a tip surface, and a connection portion between the at least one side surface and the tip surface, wherein the solder layer is in contact with the tip surface, and wherein the at least one side surface and the tip surface form an obtuse angle at the connection portion.

2. The electronic device member according to claim 1, wherein:

the at least one side surface includes a first region extending from the connection portion to between the connection portion and the first substrate; and the first region and the tip surface form an obtuse angle.

3. The electronic device member according to claim 2, wherein:

the at least one protruding portion includes a base surface located opposite the tip surface in a direction in which the at least one protruding portion protrudes;

the at least one side surface includes a second region located between the base surface and the first region; and the second region and the base surface form an obtuse angle.

4. The electronic device member according to claim 1, wherein:

the at least one protruding portion includes a base surface located opposite the tip surface in a direction in which the at least one protruding portion protrudes; and a width of the tip surface is smaller than a width of the base surface.

5. The electronic device member according to claim 1, wherein:

the at least one protruding portion includes a base surface located opposite the tip surface in a direction in which the at least one protruding portion protrudes; and a width of the at least one protruding portion monotonically decreases from the base surface to the tip surface.

6. The electronic device member according to claim 1, wherein the at least one protruding portion includes a base surface located opposite the tip surface in a direction in which the at least one protruding portion protrudes, and an intermediate portion having a width greater than both a width of the tip surface and a width of the base surface.

7. The electronic device member according to claim 1, wherein the at least one protruding portion includes a base surface located opposite the tip surface in a direction in which the at least one protruding portion protrudes, and a discontinuous portion at which a width of the at least one protruding portion increases discontinuously from the tip surface toward the base surface.

8. An electronic device comprising the electronic device member according to claim 1 and a second substrate, wherein the first substrate is joined to the second substrate via the at least one protruding portion and the solder layer.

* * * * *